United States Patent [19]

Iguchi et al.

[11] Patent Number: 6,071,673
[45] Date of Patent: Jun. 6, 2000

[54] METHOD FOR THE FORMATION OF RESIST PATTERN

[75] Inventors: Etsuko Iguchi, Tokyo; Toshimasa Nakayama; Taiichiro Aoki, both of Kanagawa, all of Japan

[73] Assignee: Tokyo Ohka Kogyo Co., Ltd., Kanagawa, Japan

[21] Appl. No.: 09/138,073

[22] Filed: Aug. 21, 1998

[30] Foreign Application Priority Data

Aug. 21, 1997 [JP] Japan ..................................... 9-240394

[51] Int. Cl.[7] ........................................................ G03F 7/00
[52] U.S. Cl. ........................ 430/271.1; 430/322; 430/950; 525/154
[58] Field of Search ..................................... 430/322, 950, 430/327, 271.1; 525/154, 523, 326

[56] References Cited

U.S. PATENT DOCUMENTS 5,693,691  12/1997  Flaim et al. .............................. 523/436
5,733,714   3/1998  McCulloch et al. ..................... 430/325
5,851,738  12/1998  Thackeray et al. ..................... 430/327
5,886,102   3/1999  Sinta et al. .............................. 525/154

*Primary Examiner*—Kathleen Duda
*Attorney, Agent, or Firm*—Sughrue, Mion, Zinn, Macpeak & Seas, PLLC

[57] ABSTRACT

The present invention provides a method for the formation of a pattern, which comprises applying an antireflective coating film-forming composition solution comprising (A) a compound which undergoes crosslinking reaction when irradiated with actinic rays and (B) a dye to a substrate to form a coating film thereon, entirely irradiating the coating film with actinic rays to form an antireflective coating film, applying a resist solution to the antireflective coating film, drying the coated material to form a resist layer, and then subjecting the coated material to lithographic treatment to form a resist pattern on the antireflective coating film. The method enables the formation of a resist pattern having an excellent dimensional accuracy and section shape without causing the formation of an intermixed layer between the resist composition and antireflective coating film.

9 Claims, No Drawings

METHOD FOR THE FORMATION OF RESIST PATTERN

FIELD OF THE INVENTION

The present invention relates to a method for forming a resist pattern. More specifically, the present invention relates to a method for forming a resist pattern in which a composition for forming an antireflective coating film is used to prevent the generation of reflective light at a semiconductor substrate.

BACKGROUND OF THE INVENTION

In the preparation of semiconductor devices such as IC and LSI, it has heretofore been a common practice that various steps such as photolithographic step using a photoresist composition, etching step, impurity diffusion step and wiring step are repeated several times. In the foregoing photolithographic step, a photoresist composition is applied to a semiconductor substrate to form a thin film thereon. The thin film is irradiated with actinic rays through a mask pattern, and then developed to form a resist pattern. As the actinic rays there have been used g-line (436 nm), i-line (365 nm), etc. However, with the enhancement of integration of semiconductor devices, light rays having a shorter wavelength such as far ultraviolet rays and exima laser have been used more and more. The shorter the wavelength of the actinic light rays used is, the more is light reflected from the substrate. This causes a great problem that the resist pattern is liable to local strain (notching) or deterioration of dimensional accuracy due to reflected light. Thus, the interposition of an antireflective coating film between the substrate and the resist layer for the purpose of inhibiting the reflection of light has been noted (see JP-B-3-67261 (The term "JP-B" as used herein means an "examined Japanese patent publication")).

While the wavelength of actinic rays used for this purpose has been reduced more and more, the resolution of resists used for this purpose has been raised higher and higher. However, if a resist composition having a high resolution is applied to a substrate having an antireflective coating film provided thereon, a so-called intermixed layer is liable to be formed at the interface of the resist composition with the antireflective coating film. This causes the generation of bites or thickening at the lower portion of the resist pattern. As a result, the section shape of the resist pattern is deteriorated, making it difficult to produce good semiconductor devices. In order to overcome these difficulties, a method which comprises heat- treating an antireflective coating film at a temperature of higher than 180° C. was proposed. However, this method is disadvantageous in that the dye in the antireflective coating film can be easily sublimated at this high temperature, causing stain on the interior of the apparatus or other troubles. Thus, this approach is not practical.

Under these circumstances, the inventors made extensive studies. As a result, it was found that when an antireflective coating film-forming composition layer is formed by a composition comprising a compound which undergoes crosslinking reaction when irradiated with actinic rays and a dye, and then entirely irradiated with actinic rays to form an antireflective coating film, the production of an intermixed layer can be inhibited without the necessity of high temperature treatment, thereby making it possible to form a resist pattern having an excellent dimensional accuracy and section shape free of bite or thickening at the lower interface thereof.

SUMMARY OF THE INVENTION

An object of the present invention is to provide a pattern forming method which allows the formation of a resist pattern having an excellent dimensional accuracy and section shape even on a substrate having an antireflective coating film formed thereon.

The present invention which accomplishes the foregoing object concerns a method for the formation of a pattern, which comprises applying an antireflective coating film-forming composition solution comprising (A) a compound which undergoes crosslinking reaction when irradiated with actinic rays and (B) a dye to a substrate to form a coating film thereon, entirely irradiating the coating film with actinic rays to form an antireflective coating film, applying a resist solution to the antireflective coating film, drying the coated material to form a resist layer, and then subjecting the coated material to lithographic treatment to form a resist pattern on the antireflective coating film.

DETAILED DESCRIPTION OF THE INVENTION

As the component (A) to be incorporated in the antireflective coating film-forming composition for use in the foregoing method for the formation of a pattern, there can be used a compound containing functional groups which undergo crosslinking with each other or a dye used in combination therewith when irradiated with actinic rays.

Examples of such a compound include a nitrogen-containing compound containing at least two amino groups substituted by either or both of hydroxyl group and alkoxyalkyl group. Examples of such a nitrogen-containing compound include melamine, urea, guanamine, benzoguanamine, glycoluryl, succinylamide and ethyleneurea in which the hydrogen atom in the amino group of which is substituted by either or both of methylol group and alkoxymethyl group. These nitrogen-containing compounds can be easily produced by a process which comprises reacting melamine, urea, guanamine, benzoguanamine, glycoluryl, succinylamide, ethyleneurea or the like with formalin in boiling water to effect methylolation, or reacting them with a lower alcohol such as methanol, ethanol, n-propanol and isopropanol to effect alkoxylation. In particular, the compound represented by the following general formula (I) is excellent in crosslinking reactivity to advantage:

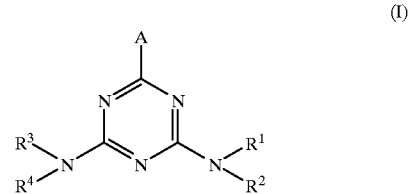

wherein A represents a hydrogen atom, an alkyl group (preferably those having 1 to 6 carbon atoms), an aralkyl group (preferably those having 6 to 10 carbon atoms), an aryl group (preferably those having 6 to 10 carbon atoms) or —$NR^5R^6$; and $R^1$, $R^2$, $R^3$, $R^4$, $R^5$ and $R^6$ may be the same or different and each represent a hydrogen atom, a methylol group or an alkoxymethyl group (preferably those having 2 to 6 carbon atoms), with the proviso that at least two of four to six $R^1$, $R^2$, $R^3$, $R^4$, $R^5$ and $R^6$'s are methylol groups or alkoxymethyl groups.

Preferred among these nitrogen-containing compounds are melamine derivatives containing from not less than 3 to less than 6 methylol or alkoxymethyl groups per melamine ring on the average and benzoguanamine derivatives. Specific examples of the foregoing melamine derivatives include $M_x$-750, a melamine derivative substituted by 3.7 methoxymethyl groups per melamine ring on the average commercially available from Sanwa Chemical Co., Ltd., and $M_w$-30, a melamine derivative substituted by 5.8 methoxymethyl groups per melamine ring on the average commercially available from Sanwa Chemical Co., Ltd. Specific examples of the benzoguanamine derivatives include Cymel Series (produced by Mitsui Cyanamid Co., Ltd.). The foregoing nitrogen-containing compound may be dimeric or trimeric. The foregoing crosslinking agents may be used singly or in combination.

As the dye to be used as the component (C) there may be used a benzophenone-based compound, azomethine-based compound, diphenylsulfone-based compound, diphenyl sulfoxide-based compound or the like. Specific examples of these compounds include benzophenone-based compounds such as 2,2',4,4'-tetrahydroxybenzophenone, 2-hydroxy-4'-dimethylamino benzophenone, 2,4-dihydroxy-4'-dimethylaminobenzophenone, 2,4-dihydroxy-4'-diethylamino benzophenone, 4,4'-bis(dimethylamino)benzophenone and 4,4'-bis(diethylamino)benzophenone, 3-hydroxy-N-(4-diethylaminobenzylidene)aniline, 2-hydroxy-N-(4-diethylaminobenzylidene)aniline, 4-hydroxy-N-(4-diethylaminobenzylidene)aniline, 4-hydroxy-N-(4-diethylaminobenzylidene)-1-naphthylamine, 2-hydroxy-5-chloro-N-(4-diethylaminobenzylidene)aniline, 2,4-dihydroxy-N-(4-diethylaminobenzylidene)aniline, 3-nitro-4-hydroxy-N-(4-diethylaminobenzylidene)aniline, 2-methyl-4-hydroxy-N-(4-diethylaminobenzylidene) aniline, 3-hydroxy-4-methoxy-N-(4-diethylaminobenzylidene)aniline, 4-diethylamino-N-(3-hydroxy-4-methoxybenzylidene)aniline, and azomethine-based compounds represented by the following chemical formulae:

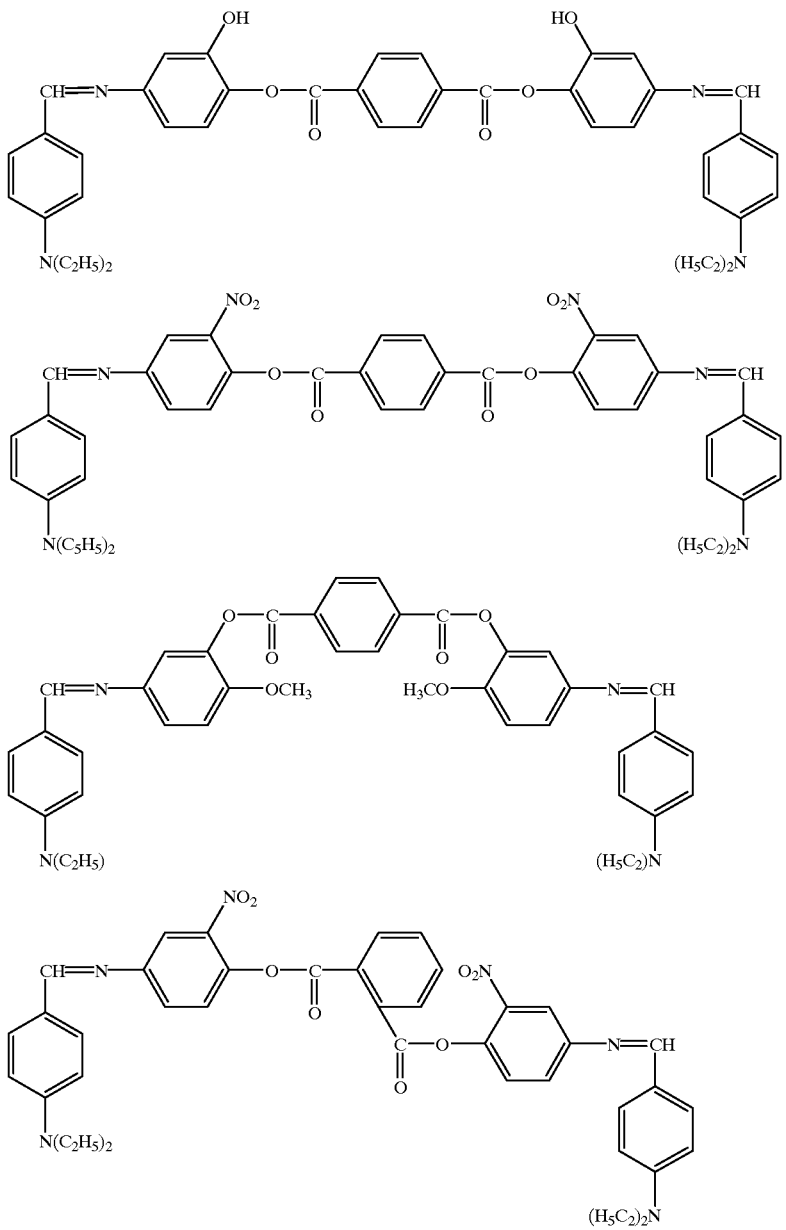

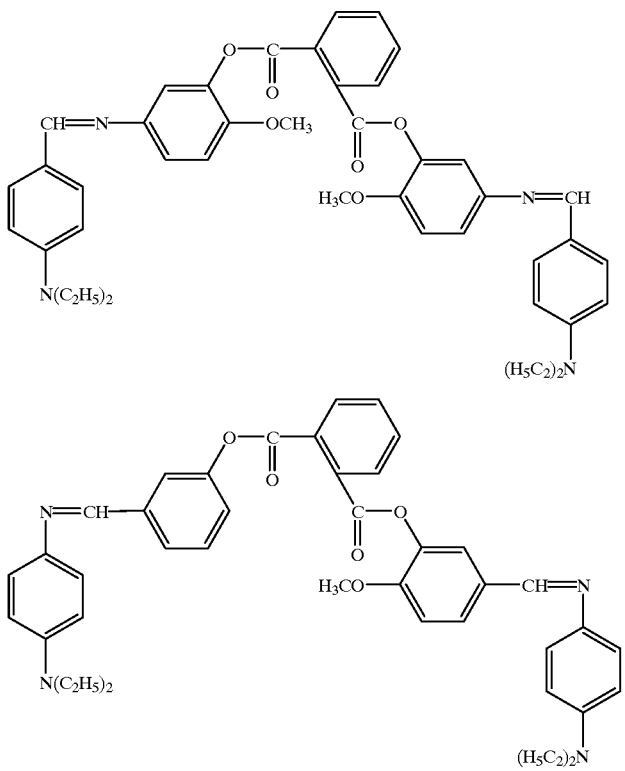

Further examples of the dye include diphenylsulfone-based compounds such as bis(2,4-dihydroxyphenyl)sulfone, bis(3,4-dihydroxyphenyl)sulfone, bis(3,5-dihydroxyphenyl)sulfone, bis(3,6-dihydroxyphenyl)sulfone, bis(4-hydroxyphenyl)sulfone, bis(3-hydroxyphenyl)sulfone and bis(3,5-dimethyl-4-hydroxyphenyl)sulfone, and diphenyl sulfoxide-based compounds such as bis(2,3-dihydroxyphenyl)sulfoxide, bis(5-chloro-2,3-dihydroxyphenyl)sulfoxide, bis(2,4-dihydroxyphenyl)sulfoxide, bis(2,4-dihydroxy-6-methylphenyl)sulfoxide, bis(5-chloro-2, 4-dihydroxyphenyl)sulfoxide, bis(2,5-dihydroxyphenyl)sulfoxide, bis(3,4-dihydroxyphenyl)sulfoxide, bis(3,5-dihydroxyphenyl)sulfoxide, bis(2,3,4-trihydroxyphenyl)sulfoxide, bis(2,3,4-trihydroxyphenyl)sulfoxide, bis(2,3,4-trihydroxy-6-methylphenyl)sulfoxide, bis(5-chloro-2,3,4-trihydroxyphenyl)sulfoxide, bis(2,4,6-trihydroxyphenyl)sulfoxide and bis(5-chloro-2,4,6-trihydroxyphenyl)sulfoxide. These dyes may be used singly or in combination.

The content of the component (A) is generally from 10 to 300 parts by weight, preferably from 20 to 200 parts by weight, based on 100 parts by weight of the content of the component (B).

Besides the foregoing components, the composition for forming an antireflective coating film of the present invention may further comprise a binder resin such as polyamidic acid, polystyrene, halogenated polymer, polyacetal, polyacetal copolymer, α-substituted vinyl polymer, polybutenesulfonic acid and acrylic acid or a compatible additive such as organic acid (e.g., acetic acid, oxalic acid, maleic acid, o-hydroxybenzoic acid, 3,5-dinitrobenzoic acid, 2,6-dihydroxybenzoic acid, copolymer of o-hydroxybenzoic acid and p-xylene (trade name: SAX, produced by Mitsui Toatsu Chemicals, Inc.)) incorporated therein.

The composition for forming an antireflective coating film of the present invention may further comprise a common additive such as surface actinic agent incorporated therein for the purpose of improving the coatability or inhibiting striation as necessary. Examples of the foregoing surface actinic agent include fluorine-based surface actinic agents such as SURFLON SC-103, SR-100 (produced by Asahi Glass Co., Ltd.), EF-351 (produced by Tohoku Hiryou K.K.), and FLORAD $F_c$-431 and FLORAD $F_c$-176 (produced by Sumitomo 3M Limited). The composition for forming an antireflective coating film of the present invention may further comprise a plasticizer, stabilizer, etc. incorporated therein. The content of these additives is preferably less than 2,000 ppm based on the solid content of the composition solution for forming an antireflective coating film.

The composition for forming an antireflective coating film of the present invention comprising the foregoing components is used in the form of solution in a solvent. Specific examples of such a solvent include ethylene glycol monomethyl ether, ethylene glycol monoethyl ether, ethylene glycol monopropyl ether, ethylene glycol monobutyl ether, ethylene glycol dimethyl ether, ethylene glycol diethyl ether, ethylene glycol monopropyl ether, ethylene glycol dipropyl ether, propylene glycol monomethyl ether, propylene glycol monoethyl ether, propylene glycol monopropyl ether, propylene glycol monobutyl ether, propylene glycol dimethyl ether, propylene glycol diethyl ether, diethylene glycol monomethyl ether, diethylene glycol monoethyl ether, diethylene glycol monophenyl ether, diethylene glycol dimethyl ether, diethylene glycol diethyl ether, ethylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monoethyl ether acetate, diethylene glycol monopropyl ether acetate, diethylene glycol monophenyl ether acetate, propylene glycol monomethyl ether acetate, propylene glycol monoethyl ether acetate, propylene glycol monopropyl ether acetate, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, acetone, methyl ethyl ketone, diethyl ketone, methyl isobutyl ketone, ethyl isobutyl ketone, tetrahydrofuran, cyclopentanone, cyclohexanone, methyl propionate, ethyl propionate, propyl propionate, isopropyl propionate, methyl 2-hydroxypropionate, ethyl 2-hydroxypropionate, 2-hydroxy-2-methyl-3-methoxypropionate, ethyl-3-methoxypropionate, ethyl-3-ethoxypropionate, ethyl-3-propoxypropionate, propyl-3-methoxypropionate, isopropyl-3-methoxypropionate, ethyl ethoxyacetate, ethyl oxyacetate, methyl 2-hydroxy-3-methylbutanate, methyl lactate, ethyl lactate, propyl lactate, isopropyl lactate, butyl lactate, isoamyl lactate, methyl acetate, ethyl acetate, propyl acetate, isopropyl acetate, butyl acetate, isoamyl acetate, methyl carbonate, ethyl carbonate, propyl carbonate, butyl carbonate, methyl pyruvate, ethyl pyruvate, propyl pyruvate, butyl pyruvate, methyl acetoacetate, ethyl acetoacetate, benzyl methyl ether, benzyl ethyl ether, dihexyl ether, benzyl acetate, ethyl benzoate, diethyl oxalate, diethyl maleate, γ-butyrolactone, benzene, toluene, xylene, cyclohexanone, methanol, ethanol, propanol, butanol, hexanol, cyclohexanol, ethylene glycol, diethylene glycol, and glycerin. These solvents may be used singly or in admixture.

As the actinic rays with which the antireflective coating film-forming composition is irradiated, there can be preferably used ultraviolet rays. Examples of the light source which emits ultraviolet rays include low-voltage mercury vapor lamp, high-voltage mercury vapor lamp, ultrahigh-voltage mercury vapor lamp, and xenon lamp. Preferably, a light source having the highest intensity at a wavelength of from 100 to 300 nm is used. The luminous intensity of such a light source is preferably at least 150 mJ/cm$^2$ of ultraviolet rays having a wavelength of from 100 to 300 nm. The irradiation with actinic rays is preferably effected under reduced pressure, more preferably under reduced pressure and heating. The foregoing irradiation with actinic rays may be effected at the same time with or after heating under reduced pressure. Alternatively, the irradiation with actinic rays may be effected while the heating temperature is being gradually raised under reduced pressure. The pressure in the evacuated system is not more than 100 Torr, preferably not more than 30 Torr. If the pressure in the evacuated system exceeds 100 Torr, a sufficiently crosslinked homogeneous antireflective coating film cannot be formed. The heat treatment temperature may be properly determined according to the kind and thickness of the antireflective coating film-forming composition layer and is not specifically limited. However, the heat treatment temperature is preferably not higher than 150° C. If the heating temperature exceeds 150° C., it can easily cause the sublimation of the dye in the antireflective coating film-forming composition which stains the interior of the apparatus. Examples of the heating method include hot-plate heating method, and far infrared lamp heating method.

An embodiment of the pattern forming method according to the present invention will be described hereinafter. This embodiment of the pattern forming method according to the present invention comprises (i) a step of dissolving an antireflective coating film-forming composition in a solvent to prepare a coating solution, and then applying the coating solution to a substrate such as silicon wafer and glass substrate by a coating means such as applicator, bar coater, spinner and curtain flow coater, preferably followed by drying, to form an antireflective coating film, (ii) a step of entirely irradiating the antireflective coating film with ultraviolet rays under reduced or atmospheric pressure to cause crosslinking reaction, and (iii) a step of forming a resist layer on the antireflective coating film, and then subjecting the material to lithographic treatment to form a resist patter. The thickness of the antireflective coating film-forming composition layer at the step (i) of the pattern forming method may be such that it can cover the surface of the substrate, for example, from 30 to 200 nm. It may be properly determined according to the magnitude of the unevenness on the surface of the substrate. It is preferred that the antireflective coating film exposed through the resist pattern formed as a mask according to the foregoing forming method is subjected to dry etching using plasma treatment, etc.

As the resist to be used at the step of forming a resist pattern there may be used either a positive-working or negative-working resist. Examples of the positive-working resist include a positive-working resist containing an alkali-soluble novolak resin and naphthoquinone-1,2-diazidesulfonic acid ester, a chemically-sensitized positive-working resist containing an alkali-insoluble resin component containing an acid-dissociating substituent, which enhances solubility in an alkali when acted on by an acid, and a compound which produces an acid upon irradiation with radiation, and a chemically-sensitized positive-working resist containing an alkali-soluble resin, a low molecular weight compound containing an acid-dissociating substituent and being alkali-soluble, which enhances solubility in an alkali when acted on by an acid, and a compound which produces an acid upon irradiation with radiation. Examples of the negative-working resist include a chemically-sensitized negative-working resist containing an alkali-soluble novolak resin or an alkali-insoluble resin component containing an acid-dissociating substituent which enhances solubility in an alkali when acted on by an acid, an acid crosslinking component, and a compound which produces an acid upon irradiation with radiation, and a photopolymerizable negative-working resist containing an alkaline crosslinkable resin, a monomer containing an ethylenically unsaturated double bond, a photopolymerization initiator and a dye or pigment.

As the developer to be used in development at the lithographic processing step there can be used a general-purpose alkaline developer such as aqueous solution of hydroxide, carbonate, bicarbonate, phosphate or pyrophosphate of alkaline metal (e.g., lithium, sodium, potassium, calcium), primary amine (e.g., benzylamine, butylamine), secondary amine (e.g., dimethylamine, dibenzylamine, diethanolamine), tertiary amine (e.g., trimethylamine, triethylamine, triethanolamine), cyclic amine (e.g., morpholine, piperazine, pyridine), polyamine (e.g., ethylenediamine, hexamethylenediamine), ammonium hydroxide (e.g., tetraethylammonium hydroxide, trimethylbenzylammonium hydroxide, trimethylphenylbenzylammonium hydroxide) or sulfonium hydroxide (e.g., trimethylsulfonium hydroxide, diethylmethylsulfonium hydroxide, dimethylbenzylsulfonium hydroxide), choline and silicate-containing buffer.

The present invention will be further described in the following examples, but the present invention should not be construed as being limited thereto.

EXAMPLE 1

50 g of $M_x$-750 (produced by Sanwa Chemical Co., Ltd.) having methoxymethyl groups attached thereto as substituents in an amount of 3.7 per melamine ring on the average, 50 g of bis(4-hydroxyphenyl)sulfone and 500 ppm of $F_c$-430 (produced by Sumitomo 3M) as a fluorine-based surface active agent were dissolved in 1,000 g of propylene glycol monomethyl ether acetate. The solution thus obtained was filtered through a membrane filter having a pore diameter of 0.2 μm to prepare an antireflective coating film-forming composition solution. The solution thus prepared was applied to a 6 inch silicon wafer by means of a spinner, and then dried at a temperature of 90° C. for 90 seconds to form an antireflective coating film-forming composition layer.

Subsequently, the foregoing silicon wafer having an antireflective coating film provided thereon was placed on a hot plate in a vacuum treatment apparatus having a low-voltage mercury vapor lamp incorporated therein provided with a hot plate. The air in the vacuum treatment apparatus was then evacuated by a vacuum pump to 0.2 Torr. The hot plate was heated to a temperature of 60° C., and the antireflective coating film was then entirely irradiated with ultraviolet rays for 5 minutes. The dosage of ultraviolet rays was 6 J/cm$^2$ at 253.7 nm.

A chemically-sensitized positive-working resist comprising an acid generator and a hydroxystyrene-based resin (TDUR-P007, produced by TOKYO OHKA KOGYO CO., LTD.) was applied to the foregoing antireflective coating film by means of a spinner, and then dried at a temperature of 90° C. for 90 seconds to form a resist layer having a thickness of 0.7 μm thereon. Using NSR-2005EX8A (produced by NIKON CORP.), the coated material was then exposed to light through a mask. The coated material thus exposed was heated to a temperature of 110° C. for 90 seconds, developed with a 2.38 wt% aqueous solution of tetramethyl ammonium hydroxide for 65 seconds, rinsed for 30 seconds, and then dried to form a resist pattern. The section shape of the resist pattern thus formed was then observed on a photograph taken by an electron microscope. As a result, no intermixed layers were observed at the interface of the antireflective coating film with the resist pattern. Further, no bites were observed at the portion where the antireflective coating film and the resist pattern are in contact with each other.

Subsequently, using a plasma etching apparatus (trade name: TUE-1102, produced by TOKYO OHKA KOGYO CO., LTD.), the material was dry-etched with chlorine gas as an etchant and the resist pattern as a mask at 30 mTorr, an output of 150 W and a temperature of 20° C. The resulting pattern was an image having a high dimensional accuracy faithful to the mask pattern.

EXAMPLE 2

A resist pattern was formed in the same manner as in Example 1 except that the antireflective coating film-forming composition solution which had been applied to a 6 inch silicon wafer by means of a spinner was not dried to form an antireflective coating film-forming composition layer. As a result, no intermixed layers were observed at the interface of the antireflective coating film with the resist pattern. Further, no bites were observed at the portion where the antireflective coating film and the resist pattern are in contact with each other.

Subsequently, the coated material was dry-etched with the resist pattern as a mask in the same manner as in Example 1. The resulting pattern was an image having a high dimensional accuracy faithful to the mask pattern.

EXAMPLE 3

A resist pattern was formed in the same manner as in Example 1 except that the antireflective coating film was entirely irradiated with ultraviolet rays at atmospheric pressure. As a result, no intermixed layers were observed at the interface of the antireflective coating film with the resist pattern. Further, no bites were observed at the portion where the antireflective coating film and the resist pattern are in contact with each other.

Subsequently, the coated material was dry-etched with the resist pattern as a mask in the same manner as in Example 1. The resulting pattern was an image having a high dimensional accuracy faithful to the mask pattern.

COMPARATIVE EXAMPLE

A resist pattern was formed in the same manner as in Example 1 except that the antireflective coating film was subjected to heat treatment at a temperature of 160° C. for 90 seconds instead of being entirely irradiated with ultraviolet rays under reduced pressure. As a result, an intermixed layer was observed at the interface of the antireflective coating film with the resist pattern. Further, bites were observed at the portion where the antireflective coating film and the resist pattern are in contact with each other.

Further, the dye in the antireflective coating film was sublimated during heat treatment, causing stain on the interior of the heat treatment apparatus.

In accordance with the pattern forming method of the present invention, the antireflective coating film undergoes no change of properties due to heat during the pattern formation. Further, no intermixed layers are produced between the resist layer and the antireflective coating film. Moreover, there are neither bites by antireflective coating film nor thickening generated at the lower portion of the resist pattern. Thus, a resist pattern having an excellent dimensional accuracy and section shape can be formed.

While the invention has been described in detail and with reference to specific embodiments thereof, it will be apparent to one skilled in the art that various changes and modifications can be made therein without departing from the spirit and scope thereof.

What is claimed is:

1. A method for the formation of a pattern, which comprises applying an antireflective coating film-forming composition solution comprising
   (A) a compound which undergoes a crosslinking reaction when irradiated with actinic rays and
   (B) a dye to a substrate to form a coating film thereon, entirely irradiating said coating film with actinic rays to form an antireflective coating film, applying a resist solution to said antireflective coating film, drying the resist solution to form a resist layer, and then subjecting the resist layer to lithographic treatment to form a resist pattern on said antireflective coating film;

wherein the compound which undergoes the crosslinking reaction when irradiated with actinic rays is represented by formula (I):

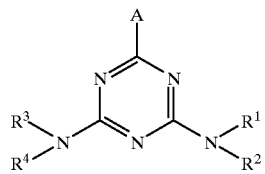 (I)

wherein A represents a hydrogen atom, an alkyl group, an aralkyl group, an aryl group or —NR$^5$R$^6$; and R$^1$, R$^2$, R$^3$, R$^4$, R$^5$ and R$^6$ may be the same or different and each represents a hydrogen atom, a methylol group or an alkoxymethyl group, with the proviso that at least two of four to six of R$^1$, R$^2$, R$^3$, R$^4$, R$^5$ and R$^6$ are methylol groups or alkoxymethyl groups.

2. The method for the formation of a pattern of claim 1, wherein the irradiation with actinic rays is effected after applying said antireflective coating film-forming composition solution and drying.

3. The method for the formation of a pattern of claim 1, wherein the irradiation with actinic rays is effected under reduced pressure.

4. The method for the formation of a pattern of claim 1, wherein the irradiation with actinic rays is effected under a pressure of from greater than 0 Torr to at most 100 Torr.

5. The method for the formation of a pattern of claim 1, wherein the irradiation with actinic rays is effected under reduced pressure and heating.

6. The method for the formation of a pattern of claim 1, wherein in formula (I), A represents an alkyl group having 1 to 6 carbon atoms.

7. The method for the formation of a pattern of claim 1, wherein in formula (I), A represents an aralkyl group having 6 to 10 carbon atoms.

8. The method for the formation of a pattern of claim 1, wherein in formula (I), A represents an aryl group having 6 to 10 carbon atoms.

9. The method for the formation of a pattern of claim 1, wherein in formula (I), A represents an alkoxymethyl group having 2 to 6 carbon atoms.

* * * * *